(12) United States Patent
Nomura et al.

(10) Patent No.: US 7,214,945 B2
(45) Date of Patent: May 8, 2007

(54) RADIATION DETECTING APPARATUS, MANUFACTURING METHOD THEREFOR, AND RADIATION IMAGE PICKUP SYSTEM

(75) Inventors: Keiichi Nomura, Saitama (JP); Masakazu Morishita, Kanagawa (JP); Chiori Mochizuki, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 407 days.

(21) Appl. No.: 10/455,457

(22) Filed: Jun. 6, 2003

(65) Prior Publication Data
US 2003/0226974 A1    Dec. 11, 2003

(30) Foreign Application Priority Data
Jun. 11, 2002  (JP)  ............................. 2002-170127
Jun. 11, 2002  (JP)  ............................. 2002-170128

(51) Int. Cl.
*G01J 1/00*   (2006.01)
(52) U.S. Cl. ..................... 250/370.08; 250/370.01; 250/336.1
(58) Field of Classification Search ............ 250/378, 250/370.01
See application file for complete search history.

(56) References Cited

U.S. PATENT DOCUMENTS

| | | | | |
|---|---|---|---|---|
| 5,307,396 A * | 4/1994 | Tsuchino | ..................... | 378/146 |
| 5,965,872 A | 10/1999 | Endo et al. | ............... | 250/208.1 |
| 6,021,173 A * | 2/2000 | Brauers et al. | ............ | 378/98.8 |
| 6,022,764 A * | 2/2000 | Park et al. | .................. | 438/151 |
| 6,044,128 A * | 3/2000 | Tanaka et al. | ............. | 378/98.8 |
| 6,072,550 A * | 6/2000 | Kim | ............................. | 349/40 |
| 6,075,256 A * | 6/2000 | Kaifu et al. | ................... | 257/53 |
| 6,107,640 A * | 8/2000 | Park et al. | ...................... | 257/59 |
| 6,144,422 A * | 11/2000 | Lee | ............................... | 349/43 |
| 6,396,046 B1 * | 5/2002 | Possin et al. | ............. | 250/208.1 |
| 6,472,665 B1 * | 10/2002 | Ishisaka et al. | ............. | 250/368 |
| 6,489,618 B1 | 12/2002 | Morishita | .............. | 250/370.09 |
| 6,756,324 B1 * | 6/2004 | Gates | .......................... | 438/791 |
| 2002/0066861 A1 | 6/2002 | Morishita | .............. | 250/370.09 |
| 2002/0079493 A1 | 6/2002 | Morishta | ..................... | 257/72 |
| 2002/0145117 A1 | 10/2002 | Mochizuki | ............. | 250/370.09 |
| 2003/0010899 A1 | 1/2003 | Ishii et al. | ................ | 250/214.1 |
| 2003/0168604 A1 * | 9/2003 | Nomura et al. | ......... | 250/370.11 |
| 2003/0218589 A1 * | 11/2003 | Watanabe et al. | ............. | 345/87 |

FOREIGN PATENT DOCUMENTS

JP           09-199699      * 7/1997

* cited by examiner

*Primary Examiner*—David Porta
*Assistant Examiner*—Djura Malevic
(74) *Attorney, Agent, or Firm*—Fitzpatrick, Cella, Harper & Scinto

(57) ABSTRACT

A radiation detecting apparatus having a radiation conversion element arranged on a switch TFT is provided. The apparatus includes a gate electrode of the switch TFT; a first insulating layer, a first semiconductor layer, and an ohmic contact layer, which are arranged on the gate electrode in order; and a source/drain electrode of the switch TFT arranged on the ohmic contact layer, which all constitute the switch TFT. The apparatus also includes a lower electrode of the radiation conversion element formed from the same layer as the source/drain electrode, a second insulating layer, a second semiconductor layer, and a second ohmic contact layer, which are arranged on the lower electrode in order, and a bias wiring for applying a bias voltage to the radiation conversion element.

8 Claims, 18 Drawing Sheets

RADIATION DETECTING APPARATUS, MANUFACTURING METHOD THEREFOR, AND RADIATION IMAGE PICKUP SYSTEM

BACKGROUND OF THE INVENTION

1. Field of the Invention

The present invention relates to a radiation detecting apparatus for detecting a radiation such as an X-ray or a γ-ray, in particular, a radiation detecting apparatus applied to a medical imaging diagnostic apparatus, a nondestructive testing apparatus, an analyzer using the radiation, or the like and to a manufacturing method therefor.

2. Related Background Art

Up to now, a photographing method adopted in the field of medical imaging diagnosis has been generally classified into ordinary photographing for obtaining a still image and fluorography for obtaining a moving image. The respective photographing methods are selected while taking into consideration a photographing apparatus as needed.

In recent years, along with progress in liquid crystal TFT technology and improvement in information (hereinafter, abbreviated to FPD) has been proposed, which includes: a sensor array composed of a photoelectric conversion element and a switch TFT using non-single crystal silicon, e.g., amorphous silicon (hereinafter, abbreviated to a-Si); and a phosphor for converging the radiation to a visible light etc., in combination. Based on the above, the possibility that absolute digitalization thereof is realized with a large area is being increased.

The FPD can instantly read the radiation image and display the read image on a display in real time. Also, the image can be directly taken out as digital information, so that features of the FPD reside in easiness in storing data or handling the data inclusive of data processing and data transfer. It has been confirmed that various characteristics such as sensitivity are exhibited, although depending on photographing conditions, at a level equal to or more than that of a conventional S/F system or CR photographing method.

FIG. 10 is a schematic equivalent circuit diagram of the FPD. In the figure, reference numeral 101 denotes a photoelectric conversion element portion; 102, a switch TFT portion; 103, a switch TFT driving wiring; 104, a signal line; 105, a bias wiring; 106, a signal processing circuit; 107, a TFT driving circuit; and 108, an A/D converter unit.

The radiation such as X-ray enters from an upper portion on the paper and undergoes the conversion to the visible light through the phosphor (not shown). The conversion light is converted to charges by the photoelectric conversion element portion 101 and accumulated therein. After that, the TFT driving circuit 107 is used to operate the transfer TFT 102 through the TFT driving wiring to transfer the accumulated charges to the signal line 104. The charges thus transferred are processed by the signal processing circuit 106 and further subjected to A/D conversion in the A/D converter unit 108 before being outputted.

Basically, the above element structure is generally employed. In particular, regarding the photoelectric conversion element, various elements have been proposed including a PIN type photo diode (hereinafter, abbreviated to PIN type PD) or an MIS type Photo Detector (hereinafter, abbreviated to MIS type PD) adopted by the inventors of the present invention, for example.

FIG. 11 is a schematic plan view showing one pixel in a case where the MIS type PD is used for the photoelectric conversion element. In the figure, reference numeral 203 denotes a lower electrode of an MIS type PD portion; 202, a switch TFT driving wiring; 204, a gate electrode of the switch TFT; 208, a sensor bias wiring; 210, a signal line; 209, source/drain electrodes (hereinafter, abbreviated to SD electrodes) of the switch TFT; and 211, a contact hole.

Further, FIG. 12 is a schematic sectional view showing the elements that are schematically arranged in one pixel of FIG. 11. In the figure, reference numeral 201 denotes a glass substrate; 202, the switch TFT driving wiring; 203, the lower electrode of the MIS type PD; 204, the gate electrode of the switch TFT; 205, a gate insulating film; 206, an intrinsic a-Si film; 207, a hole blocking layer (n+ layer: ohmic contact layer); 208, the bias wiring; 209, the SD electrodes of the transfer TFT; 210, the signal line; 220, a protective film; 221, an organic resin layer; and 222, a phosphor layer.

Next, referring to FIGS. 13 to 17, a manufacturing method for the FPD using the conventional MIS type PD will be described. In the figures, the same reference numerals as in FIG. 11 are used.

As a first step thereof, on the glass substrate, the switch TFT driving wiring 202, the MIS type PD lower electrode 203, and the switch TFT gate electrode 204 are formed of a first metallic layer. FIG. 13 is a schematic plan view thereof.

As a second step thereof, the gate insulating film, the intrinsic a-Si film, the hole blocking layer (ohmic contact layer) are laminated in order.

As a third step thereof, the contact hole (connection hole) 211 is formed, through which the MIS type PD lower electrode 203 and the SD electrodes 209 of the switch TFT are connected. FIG. 14 is a schematic plan view thereof.

As a fourth step thereof, a second metallic layer is laminated thereon. After that, the bias wiring 208 is formed through first resist work. At this time, regions where the SD electrodes 209 of the switch TFT and the signal line 210 are formed as described below are left in an island-like shape. FIG. 15 is a schematic plan view thereof.

As a fifth step thereof, the SD electrodes 209 of the switch TFT and the signal line 210 are formed through second resist work. Following this, the n+ semiconductor layer is removed. Namely, a gap portion between the SD electrodes of the switch TFT is formed, while the n+ semiconductor layer in the MIS type PD portion is left as the electrode. FIG. 16 is a schematic plan view thereof.

As a sixth step thereof, isolation between the elements is performed. FIG. 17 is a schematic plan view thereof.

As a seventh step thereof, a protective layer is laminated thereon and portions unnecessary at the time of forming a wiring lead-out portion etc. are removed. Thereafter, the phosphor is bonded thereto using the organic resin or the like.

As apparent from FIGS. 11 and 12, since the MIS type PD and the switch TFT have the same layer structure, the FPD thus manufactured has an advantage in that high yield and low cost are realized with the simple manufacturing method. In addition, the FPD is evaluated to exhibit various characteristics such as the sensitivity, which are highly satisfactory. As a result, under the present circumstances, the above FPD is adopted as the apparatus used for the ordinary photographing instead of using the conventional S/F or CR method.

Further, as apparent from FIGS. 13 to 17, in the conventional case, 6 masks are used. That is, required are the masks for steps of (1) patterning the first metallic layer, (2) patterning the connection hole, (3) patterning the second metallic layer, (4) patterning the second metallic layer in the TFT portion/patterning the ohmic contact layer, (5) patterning for the element isolation, and (6) patterning the protective layer.

However, in the above FPD, the full-digitalization is attained with the large area. Eventually, the FPD is thus being employed mainly for the ordinary photographing. In terms of sensitivity, however, a further improvement is expected. Also, in order to achieve the fluorography, it is conceivable that the achievement of much higher sensitivity is indispensable.

FIG. 18 shows a 1-bit equivalent circuit of the FPD using the MIS type PD. In the figure, reference symbol C1 denotes a synthetic capacitance of the MIS type PD; C2, a parasitic capacitance formed on the signal line; Vs, a sensor bias potential; Vr, a sensor reset potential; SW1, a Vs/Vr changeover switch of the MIS type PD; SW2, an ON/OFF changeover switch of the transfer TFT; SW3, a signal line reset switch; and Vout, an output voltage.

The MIS type PD is applied with the potential Vs as the bias potential through the switch SW1 so as to turn the semiconductor layer into the depletion layer. In this state, the conversion light from the phosphor enters the semiconductor layer, positive charges blocked by the hole blocking layer are accumulated in the a-Si layer to cause a potential difference Vt. Subsequently, the switch SW2 is used to apply an ON voltage of the switch TFT to be outputted as the voltage Vout. The output Vout is read by a reading circuit (not shown), followed by resetting the signal line through the switch SW3. Thus, the outputs are sequentially read.

According to the above driving method, the switch TFT is turned ON on the line basis to thereby complete whole reading operation in one frame. After that, the MIS type PD is supplied with the reset potential Vr through the switch SW1 for reset and applied with the bias potential Vs again to start the accumulating operation for image reading.

A saturation value of the output Vout of the MIS type PD is approximately in proportion to the potential Vt. The potential Vt is defined by the product of Vs−Vr (bias voltage difference) and G (internal Gain). The internal Gain (G) is obtained as follows: Cins/(Cins+Csemi). The output voltage Vout is outputted substantially at a capacitance ratio of C1/C2 with respect to the potential Vt.

The sensitivity of the MIS type PD can be approximately represented by the above saturation output voltage in the light incidence state, i.e., a ratio of a signal component and the output voltage in a dark state, that is, a noise component.

The signal components generally depend on (1) a PD opening ratio, (2) a PD light incidence efficiency, in other words, a quantity of light incident on the intrinsic a-Si film, and further (3) the internal Gain.

On the other hand, it is confirmed that the noise components involve the various following factors: (1) shot noise: shot noise in proportion to the square root of the value of the sensor opening ratio; (2) KTC noise: KTC noise in proportion to the square root of the value of the C1 capacitance; (3) signal wiring noise: wiring noise in proportion to the value of the square root of the wiring resistance or C2 capacitance; (4) IC noise: IC noise in proportion to the C2 capacitance; and (5) gate wiring noise: wiring noise in proportion to the square root of the value of the wiring resistance.

In general, it is needless to say that either the increase in signal component or the reduction in noise component should be achieved, or both of them should be satisfied at the same time in order to increase the sensitivity. However, the signal components and the noise components are correlated. Thus, improvement of the former affects the latter. As a result, the improvement in sensitivity is not attained in many cases.

For example, in order to improve the signal components, in the case of increasing (1) the PD opening ratio as described above, it is conceivable that the wiring width or the space between the wirings is shrunk for the improvement. This would result in the increased noise components rather than the improvement because the wiring resistance or the parasitic capacitance of the signal line increases along with the miniaturization. That is, the signal components are improved, which undesirably involves the increase in noise component. Thus, in some cases, the sensitivity reduction is caused. Further, in association with the miniaturization, the wiring rule is made strict, so that the productivity may decrease, for example, the yield may be reduced.

Also, as for (2) the light incidence efficiency described above, similarly, the ohmic contact layer bonded to the a-Si film serving as the photoelectric conversion layer is needed to function as the upper electrode as well as the carrier blocking layer. Thus, it is necessary for the ohmic contact layer to have the thickness of about 50 nm or more, which involves the light absorption beyond the ignorable level. As a result, the light absorption in the n+ film leads to the reduction in sensitivity. Needless to say, when the n+ film is made thin, the resistance of the n+ film is conversely increased, with the result that the film cannot function as the PD upper electrode.

Also, in the case of increasing (3) the internal Gain described above, the a-Si film should be made thick or the gate SiN film should be made thin. However, the a-Si film is made thick while causing the reduction in transfer ability of the switch TFT, resulting in the increase in TFT size and the decrease in opening ratio. Also, as for the increase in the a-Si film thickness, in terms of the production problems concerning the stress thereof, the generation of the foreign matters, and the like, there is imposed the limitation. Also, as for the reduction in SiN film thickness, considering the dielectric voltage at the wiring intersections etc., there is similarly imposed the limitation. Assuming that the reduction in film thickness can be attained, the noise components are increased along with the increase in parasitic capacitance C2, which hardly leads to achievement of the considerable sensitivity improvement.

On the other hand, when focusing attention on the noise reduction, the gate wiring resistance is decreased. In this case, the gate wiring should have large film thickness or large width. However, the former leads to the decrease in dielectric voltage at the wiring intersections, while the latter leads to the decrease in opening ratio.

Also, when the wiring resistance of the signal line is decreased, the signal line should have the large film thickness or large width. However, the former involves not only the limitations in terms of production facilities due to the increased stress, but also the limitation on increase in film thickness from the viewpoint of working. Alternatively, the latter leads to the decrease in opening ratio similarly to the above case.

As explained above, with the existing structure, the sensitivity is optimized in design. In other words, for the realization of the much higher sensitivity, the improvement in basic structure, material, and manufacturing process is required.

On the contrary, various structures have been proposed, in which the opening ratio is increased by laminating the sensor elements on the switch elements. However, the switch elements and the sensor elements are formed on the different layers, resulting in the complicated process. Further, there arises a problem in that the number of masks increases as compared with the above case of forming the elements using the same layer.

SUMMARY OF THE INVENTION

An object of the present invention is accordingly to increase an opening ratio with a lamination structure for a cassette type, mammography, or the like, for which high definition is required and to provide a manufacturing method for a radiation detecting apparatus with a simple process.

In order to achieve the above-mentioned object, the present invention provides a manufacturing method for a radiation detecting apparatus having a radiation signal conversion element laminated on a switch TFT, characterized by including the steps of: forming a gate electrode of the switch TFT and a driving wiring using a first metallic layer; sequentially laminating a first insulating layer, a first semiconductor layer, and an etch stop insulating layer; etching the etch stop insulating layer; laminating an ohmic contact layer thereon; laminating a second metallic layer thereon; forming source/drain electrodes of the switch TFT and a signal line, and a lower electrode of the radiation signal conversion element using the second metallic layer; sequentially laminating a second insulating layer, a second semiconductor layer, and a second ohmic contact layer; forming a connection hole passing through at least the second insulating layer and the second semiconductor layer; laminating a third metallic layer thereon; forming a bias wiring of the radiation signal conversion element using a third metallic layer; laminating a transparent electrode layer thereon; etching the transparent electrode layer and the second ohmic contact layer; laminating a protective layer thereon; and forming the protective layer.

Through the above steps, the opening ratio of the radiation detecting apparatus increases, so that sensitivity can be increased. At the same time, because of a simple manufacturing process therefor, high yield in manufacturing can be attained without involving an increase in cost.

DESCRIPTION OF THE PREFERRED EMBODIMENTS

Hereinafter, embodiments of the present invention will be described with reference to the drawings.

(Embodiment 1)

First, a description will be made of an X-ray detecting apparatus using an MIS type PD in accordance with Embodiment 1.

Figure 1:
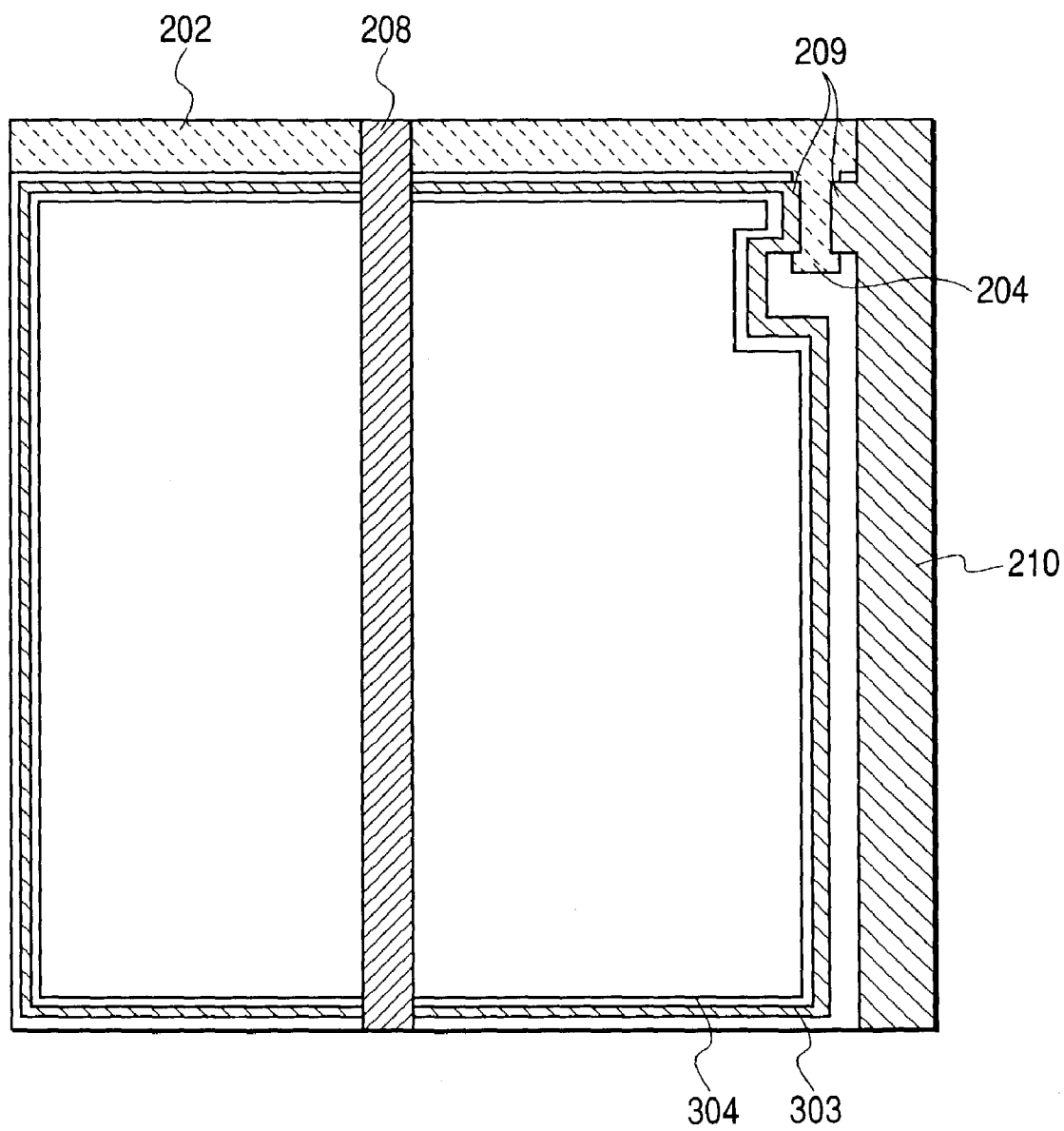
FIG. 1 is a schematic plan view in accordance with Embodiment 1 of the present invention.

FIG. 1 is a schematic plan view showing one pixel in a case where the MIS type PD is used for a photoelectric conversion element (radiation signal conversion element). In the figure, reference numeral 202 denotes a switch TFT driving wiring; 204, a gate electrode of the switch TFT; 208, a sensor bias wiring; 210, a signal line; 209, source/drain electrodes (hereinafter, abbreviated to SD electrodes) of the switch TFT; 303, a second ohmic contact layer; and 304, a transparent electrode layer.

Figure 2:
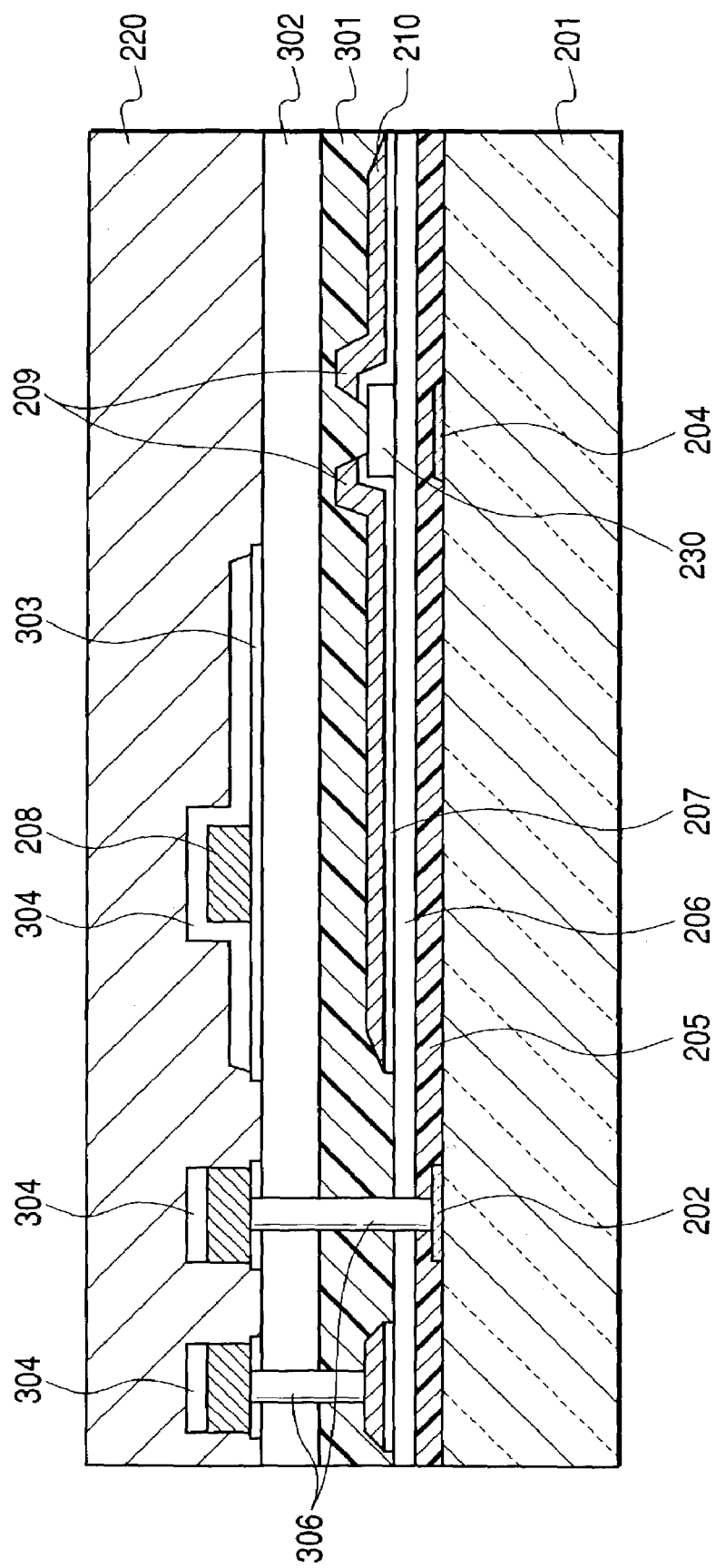
FIG. 2 is a schematic sectional view in accordance with Embodiment 1 of the present invention.

Also, FIG. 2 is a schematic sectional view showing the elements that are schematically arranged in one pixel of FIG. 1. For convenience in explanation of a manufacturing flow, a portion is also illustrated, in which the switch TFT driving wiring and the signal line are connected with a pad portion through a connection hole. In the figure, reference numeral 201 denotes a glass substrate; 202, the switch TFT driving wiring; 204, the gate electrode of the switch TFT; 205, a first gate insulating film; 206, a first intrinsic a-Si film; 230, a channel stopper (etch stopper) layer; 207, a first ohmic contact layer; 208, the bias wiring; 209, the SD electrodes of a transfer TFT; 210, the signal line; 220, a protective film; 301, a second gate insulating film; 302, a second intrinsic a-Si film; 303, the second ohmic contact layer; 304, the transparent electrode layer; and 306, connection holes.

Next, a manufacturing method for an FPD (Flat Panel Detector) of this embodiment will be described.

Figure 3:
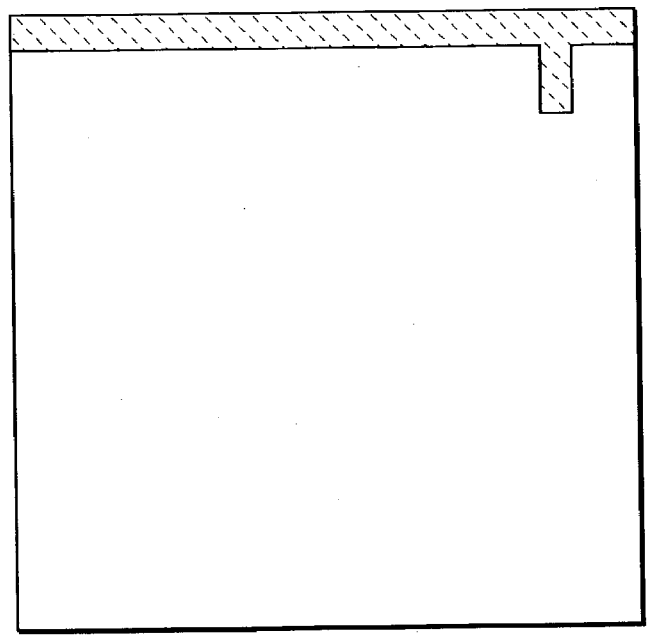
FIG. 3 is a schematic plan view illustrating a manufacturing method in accordance with Embodiment 1 of the present invention.

As a first step thereof, on a glass substrate, the switch TFT driving wiring 202 and the switch TFT gate electrode 204 are formed of a first metallic layer. FIG. 3 is a schematic plan view thereof. The first metallic layer is formed of Cr, Al, Mo, Ti, or Al—Nd alloy or formed by laminating them through sputtering.

As a second step thereof, the first gate insulating film 205, the first intrinsic a-Si film 206, and an insulating film for channel stopper (etch stopper) 230 are laminated in order using plasma CVD method.

As a third step thereof, the insulating film for channel stopper is etched through rear-side exposure.

As a fourth step thereof, the ohmic contact layer (n+ layer) 207 is laminated thereon by using plasma CVD.

As a fifth step thereof, a second metallic layer is laminated thereon. The second metallic layer is formed of Cr, Al, Mo, Ti, or Al—Nd alloy or formed by laminating them through sputtering.

Figure 4:
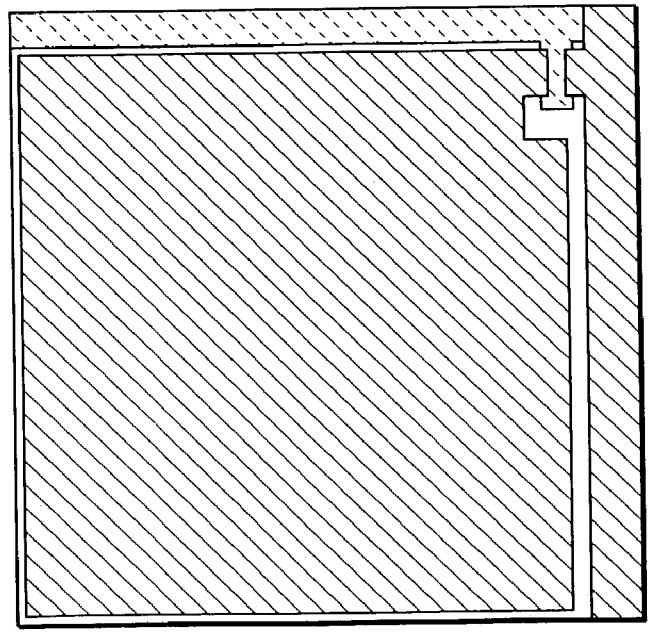
FIG. 4 is a schematic plan view illustrating a manufacturing method in accordance with Embodiment 1 of the present invention.

As a sixth step thereof, the source/drain electrodes 209 of the switch TFT and the signal line 307, and the lower electrode of the radiation signal conversion element are formed through resist work. FIG. 4 is a schematic plan view thereof.

As a seventh step thereof, the second gate insulating film 301, the second intrinsic a-Si film 302, and the second ohmic contact layer (n+ layer) 303 are laminated in order by using plasma CVD.

As an eighth step thereof, the contact hole (connection hole) 306 passing through at least the second gate insulating film 301 and the second intrinsic a-Si film 302 and the second ohmic contact layer (n+ layer) 303 is formed.

As a ninth step thereof, a third metallic layer is laminated thereon. The third metallic layer is formed of Cr, Al, Mo, Ti, or Al—Nd alloy or formed by laminating them through sputtering.

Figure 5:
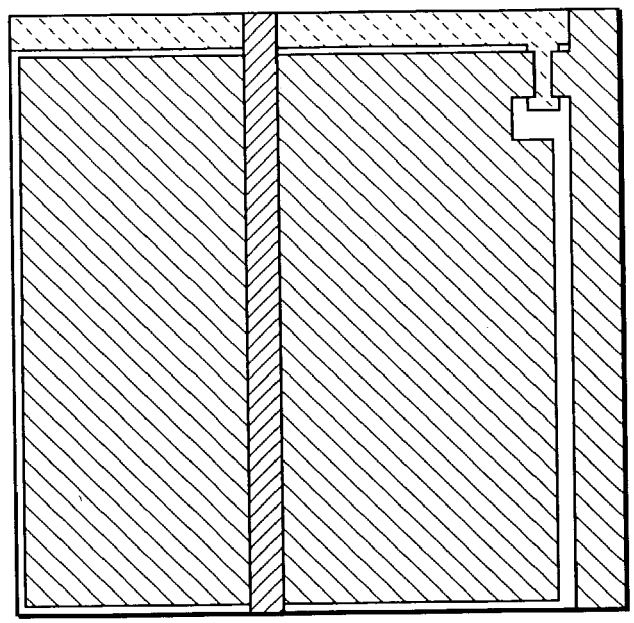
FIG. 5 is a schematic plan view illustrating a manufacturing method in accordance with Embodiment 1 of the present invention.

As a tenth step thereof, the bias wiring 208 of the photoelectric conversion element is formed through the resist work. FIG. 5 is a schematic plan view thereof.

As an eleventh step thereof, the transparent electrode layer 304 is laminated thereon. The transparent electrode layer is made of ITO (indium tin oxide), ZnO, tin oxide (SnO$_2$), and the like.

Figure 6:
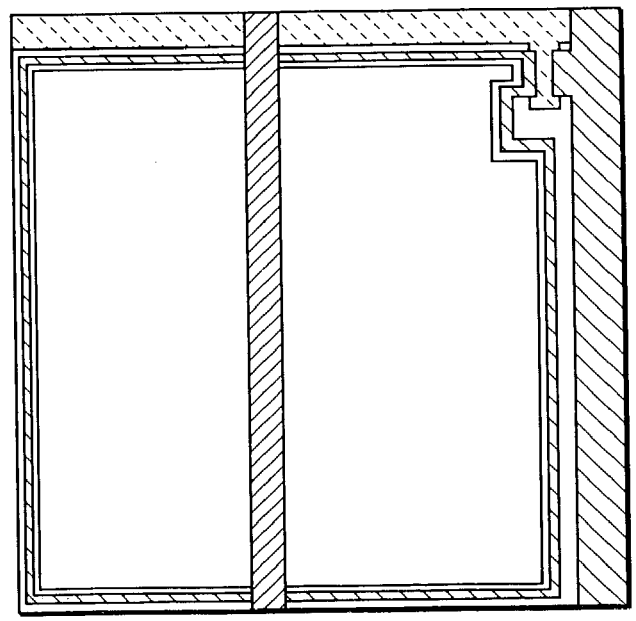
FIG. 6 is a schematic plan view illustrating a manufacturing method in accordance with Embodiment 1 of the present invention.

As a twelfth step, the transparent electrode layer and the second ohmic contact layer are etched. FIG. 6 is a schematic plan view thereof.

As a thirteenth step thereof, the protective layer is laminated thereon and regions unnecessary upon formation of a wiring lead-out portion etc. are removed.

After that, a phosphor is bonded thereto using organic resin or the like. Through the above steps, the FPD of the present invention is manufactured.

Further, as apparent from FIGS. 3 to 6, this embodiment adopts 6 masks. That is, required are the masks for the steps of (1) patterning the first metallic layer, (2) patterning the second metallic layer, (3) patterning the connection hole, (4) patterning the third metallic layer, (5) patterning the transparent electrode layer and the ohmic contact layer of the TFT portion, and (6) patterning the protective layer.

Through such a manufacturing flow, the fill factor can be increased to thereby enhance the sensitivity without using more masks than the conventional cases. That is, because of the simple manufacturing process, high yield in manufacturing can be attained at low cost.

(Embodiment 2)

Next, the X-ray detecting apparatus using the MIS type PD according to Embodiment 2 will be described.

Figure 7:
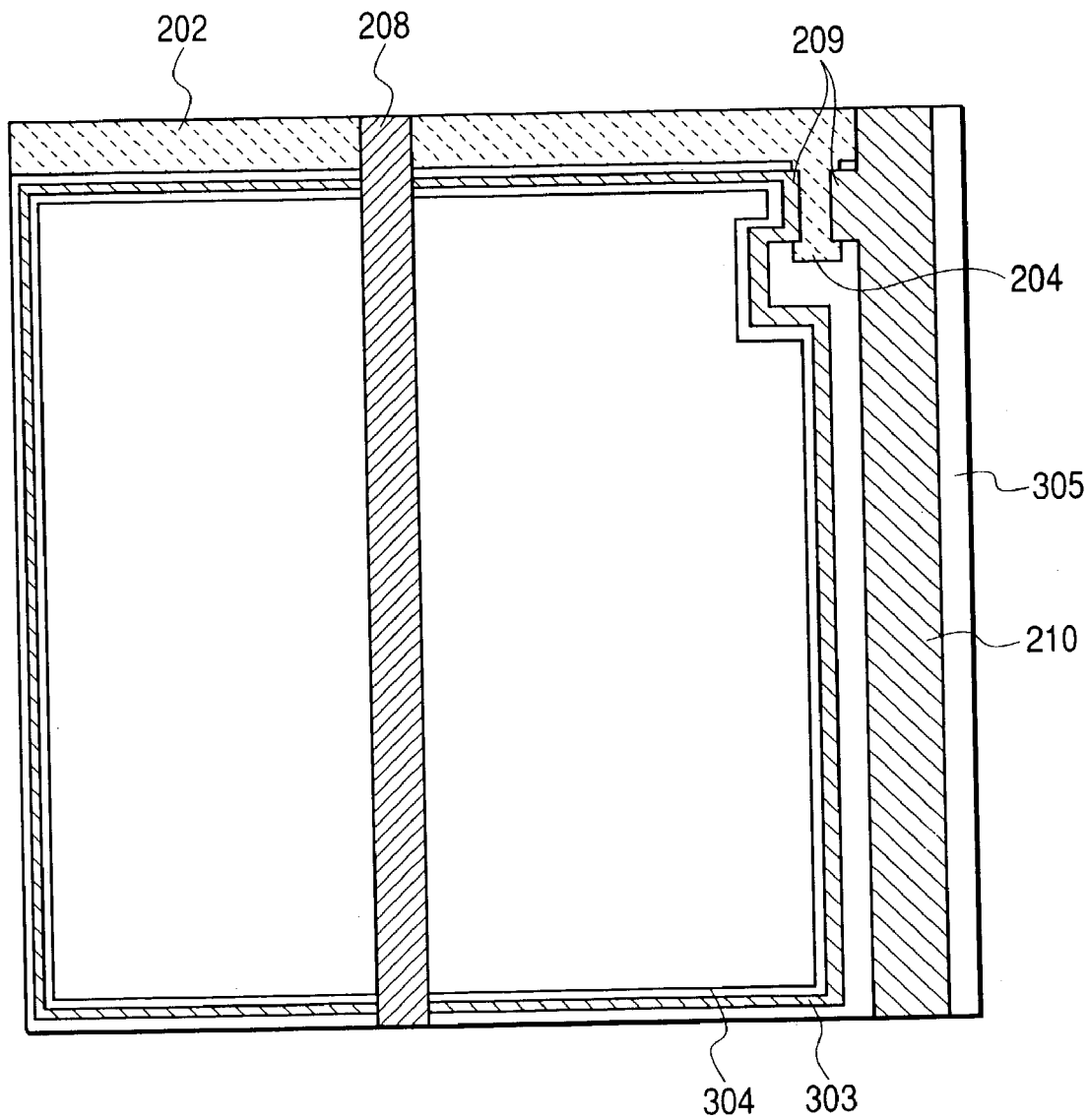
FIG. 7 is a schematic plan view in accordance with Embodiment 2 of the present invention.

FIG. 7 is a schematic plan view showing one pixel in the case of using the MIS type PD for the photoelectric conversion element. In the figure, reference numeral 202 denotes the switch TFT driving wiring; 204, the gate electrode of the switch TFT; 208, the sensor bias wiring; 210, the signal line; 209, the source/drain electrodes (hereinafter, abbreviated to SD electrodes) of the switch TFT; 303, the second ohmic contact layer; 304, the transparent electrode layer; and 305, an element isolation portion.

Figure 8:
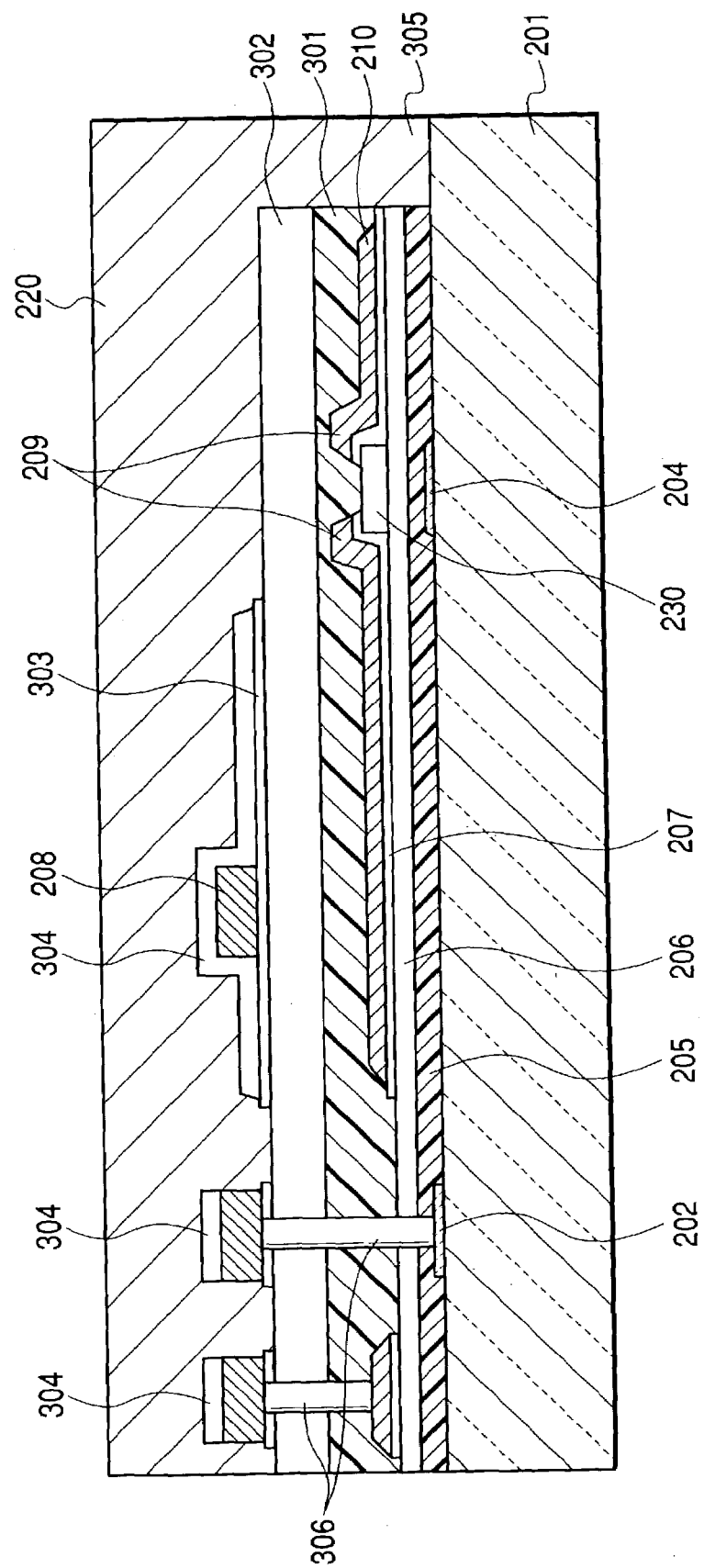
FIG. 8 is a schematic sectional view in accordance with Embodiment 2 of the present invention.

Also, FIG. 8 is a schematic sectional view showing the elements that are schematically arranged in one pixel of FIG. 7. In the figure, reference numeral 201 denotes the glass substrate; 202, the switch TFT driving wiring; 204, the gate electrode of the switch TFT; 205, the first gate insulating film; 206, the first intrinsic a-Si film; 203, a channel stopper (etch stopper) layer; 207, the first ohmic contact layer; 208, the bias wiring; 209, the SD electrodes of the transfer TFT; 210, the signal line; 220, the protective film; 301, the second gate insulating film; 302, the second intrinsic a-Si film; 303, the second ohmic contact layer; 304, the transparent electrode layer; 305, the element isolation portion; and 306, the connection hole.

Next, a manufacturing method for the FPD of this embodiment will be described.

The processing up to the sequential lamination of the second gate insulating film, the second intrinsic a-Si film, and the second ohmic contact layer (n+ layer) through plasma CVD is the same as in Embodiment 1.

Next, the contact hole (connection hole) 306 is formed. At this time, the element isolation is performed in the pixel simultaneously with the formation of the contact hole.

Subsequently, the third metallic layer is laminated thereon. The third metallic layer is formed of Cr, Al, Mo, Ti, or Al—Nd alloy or formed by laminating them through sputtering.

After that, the bias wiring of the photoelectric conversion element is formed through the resist work.

Following this, the transparent electrode layer is laminated thereon. The transparent electrode layer is made of ITO (indium tin oxide), ZnO, tin oxide (SnO$_2$), and the like.

Next, the transparent electrode layer and the second ohmic contact layer are etched.

Subsequently, the protective layer is laminated thereon and regions unnecessary upon formation of the wiring lead-out portion etc. are removed.

After that, the phosphor is bonded thereto using the organic resin or the like. Through the above steps, the FPD of the present invention is manufactured.

Further, this embodiment adopts 6 masks similarly to the conventional cases. Further, the element isolation contributes to reduction of crosstalk as compared with Embodiment 1.

(Embodiment 3)

Figure 19:
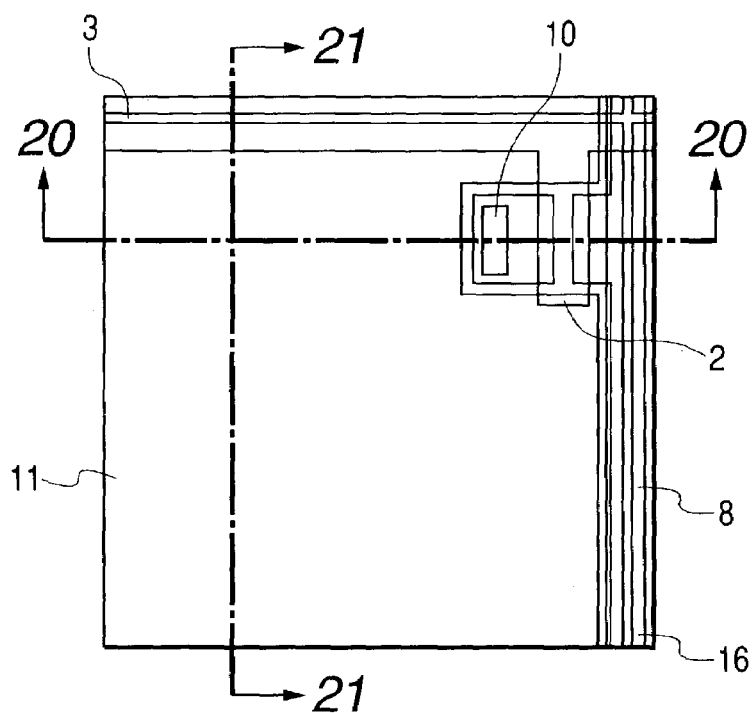
FIG. 19 is a schematic plan view showing an X-ray detection apparatus using an MIS type PD in accordance with Embodiment 3 of the present invention.
Figure 20:
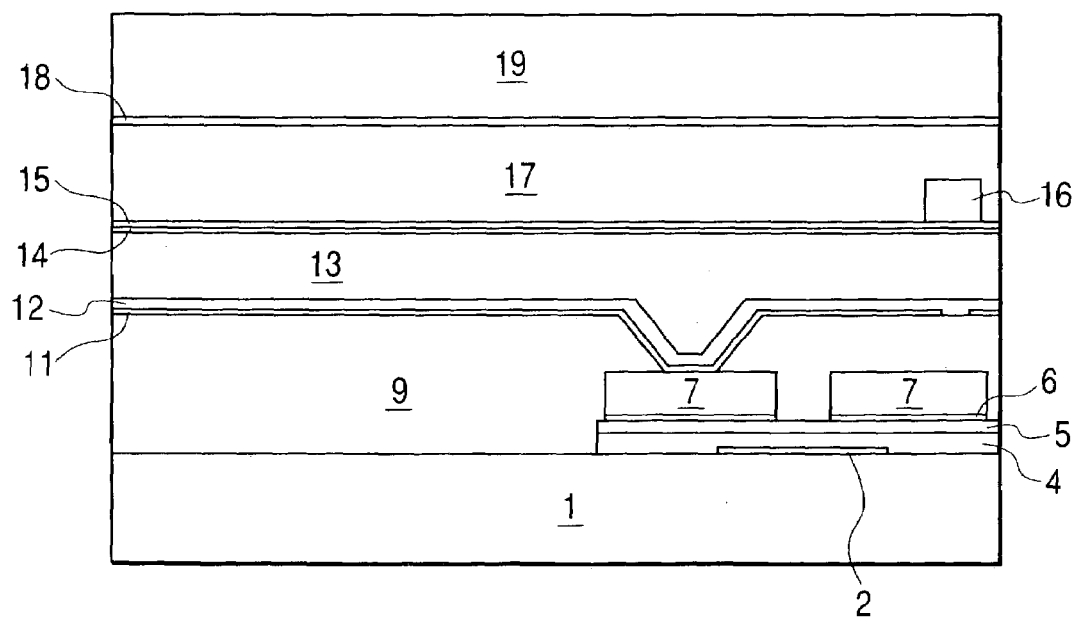
FIG. 20 is a schematic sectional view taken along the line 20—20 of FIG. 19.
Figure 21:
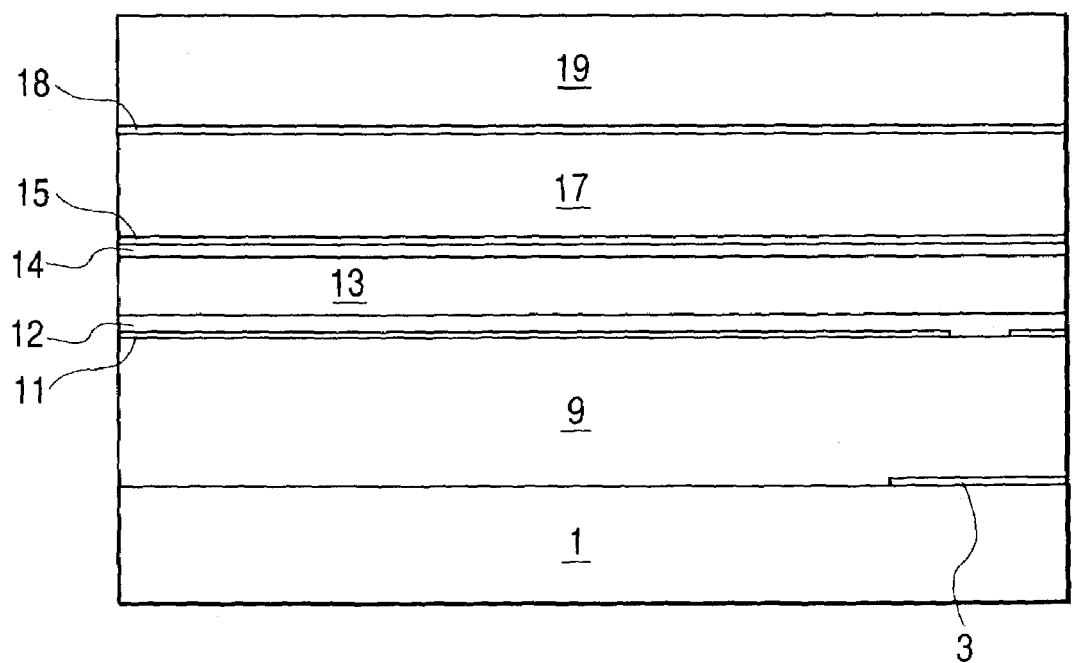
FIG. 21 is a schematic sectional view taken along the line 21—21 of FIG. 19.

FIG. 19 is a schematic plan view showing the X-ray detecting apparatus using the MIS type PD of this embodiment. FIG. 20 is a schematic sectional view taken along the line 20—20 of FIG. 19. FIG. 21 is a schematic sectional view taken along the line 21—21 of FIG. 19.

In FIGS. 19 to 21, reference numeral 1 denotes an insulating substrate; 2, a gate electrode of a switch TFT; 3, a gate wiring connected to the gate electrode 2; 4, a first insulating layer; 5, a first semiconductor layer; 6, a first ohmic contact layer; 7, source/drain electrodes of the switch TFT; 8, a signal line connected to one of the source/drain electrodes 7; 9, a first planarization layer; 10, a contact hole; 11, a pixel electrode of the MIS type PD; 12, a second insulating layer; 13, a second semiconductor layer; 14, a second ohmic contact layer; 15, a transparent electrode layer; 16, a bias wiring of the MIS type PD; 17, a second planarization layer; 18, an adhesive layer; and 19, a phosphor layer.

In this embodiment, an X-ray is converted to a visible light by the phosphor layer 19 to thereby enter the second semiconductor layer 13 of the MIS type PD. The incident light receives the photoelectric conversion in the second semiconductor layer 13 and the charges thus obtained are accumulated in the MIS type PD. After that, an ON voltage is applied from the gate wiring 3 and the switch TFT is put in an ON state. The output voltage is read through the signal line 8. Following this, the bias wiring 16 is used to apply a reset voltage to the MIS type PD portion to thereby reset the charges accumulated in the PD.

As shown in FIGS. 19 to 21, the pixel electrode 11 of the MIS type PD is arranged so as to overlap with the gate wiring 3 and the signal line 8. Also, the second insulating layer 12, the second semiconductor layer 13, and the second ohmic contact layer 14 of the MIS type PD are laminated to cover the entire pixel region. As a result, the opening ratio can be considerably increased.

In other words, almost all the conversion light from the phosphor layer 19 enters the second semiconductor layer 13 to undergo the photoelectric conversion. The charges thus converted can be captured by the pixel electrode 11 of the MIS type PD. For example, in the case of the pixel size of 160 μm, the increased opening ratio, i.e., the ratio about 1.5 times higher than the conventional ones is attained.

Further, as will be confirmed in the following manufacturing method, the switch TFT and the MIS type PD are realized with the different layer structures. Thus, an internal gain of the MIS type PD increases to reach the value about 1.5 times as high as the conventional ones. When taking into consideration the increase in opening ratio described above, the increase about twice or more the conventional ones can be achieved in total.

Also, transfer ability of the switch TFT increases at least tenfold. Therefore, the TFT size can be reduced, with the result that the parasitic capacitance depending on the TFT size is reduced and the reduction in noise is also achieved.

FIGS. 22A to 22F schematically show a manufacturing process of the FPD of FIG. 19.

Firstly, a lamination film is formed on the insulating substrate 1 through sputtering, which includes an Al—Nd thin layer with a thickness of about 250 nm, and an Mo thin layer with a thickness of about 30 nm, which constitute the gate electrode 2 and the gate wiring 3 of the switch TFT.

Figure 22A:
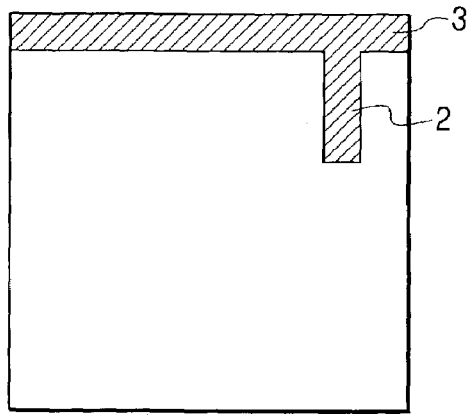
FIGS. 22A, 22B, 22C, 22D, 22E and 22F schematically show a manufacturing process of the FPD of FIG. 19.

Secondly, the driving gate wiring 3 and the gate electrode 2 of the switch TFT are patterned through photolithography using wet etching (FIG. 22A).

Thirdly, an SiN layer serving as the first insulating layer 4, an a-Si layer serving as the first semiconductor layer 5, and a phosphorous-doped n+ layer serving as the first ohmic contact layer 6 are formed by a plasma CVD apparatus with the thicknesses of about 250 nm, 100 nm, and 20 nm, respectively.

Fourthly, the metallic layer for forming the source/drain electrodes 7 of the switch TFT is formed of the Mo layer, the Al layer, and the Mo layer, through sputtering with the thicknesses of about 50 nm, 400 nm, and 30 nm, respectively.

Figure 22B:
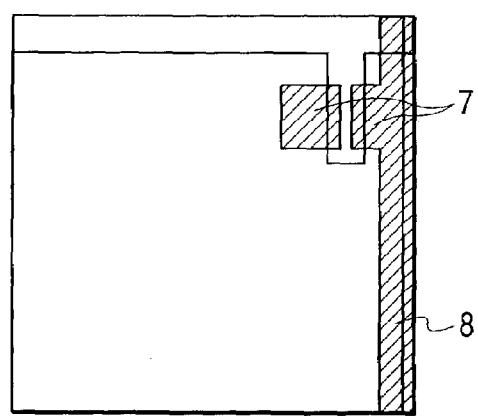

Fifthly, the source/drain electrodes 7 of the switch TFT and the signal line 8 are formed through the photolithography using the wet etching. Following this, the n+ layer of a channel portion of the switch TFT is removed with the same resist pattern using an RIE method (FIG. 22B).

Figure 22C:
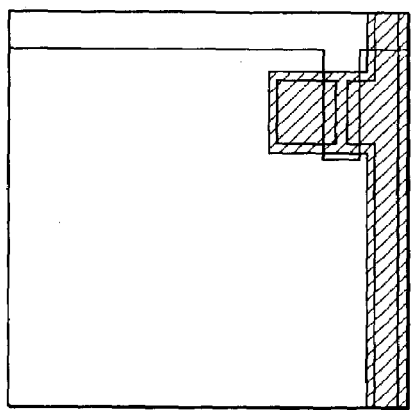

Sixthly, the first insulating layer 4, the first semiconductor layer 5, and the first ohmic contact layer 6 are removed through the photolithography using the RIE or CDE method for isolation between the elements (FIG. 22C).

Given above is the explanation of the manufacturing process for the switch TFT.

Subsequently, a process of laminating the MIS type PD on the switch TFT will be described.

Seventhly, the first planarization layer 9 (in this embodiment, made of BCB (benzo-cyclo-butene) manufactured by Dow Chemical Co.) is used for planarization. The above member exhibits extremely low dielectric constant of about 2.6 as compared with the dielectric constant of about 6.0 in the general SiN layer. The parasitic capacitance of the gate wiring 3, or the signal line 8 and the pixel electrode 11 described below can be thus reduced.

Figure 22D:
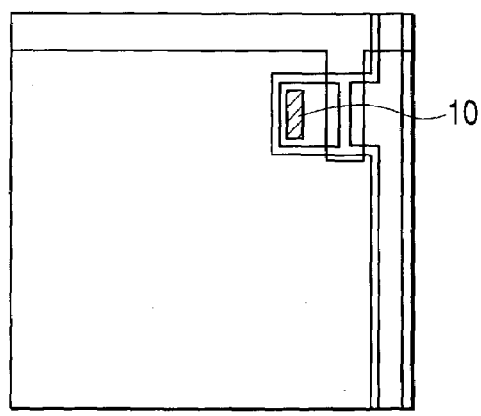

Eighthly, the contact hole 10 is formed in the first planarization layer 9 through the photolithography using the RIE or CDE method (FIG. 22D).

Ninthly, the Mo layer, the Al layer, and the Mo layer, which constitute the pixel electrode 11 are formed with the thicknesses of about 50 nm, 200 nm, and 30 nm, respectively.

Figure 22E:
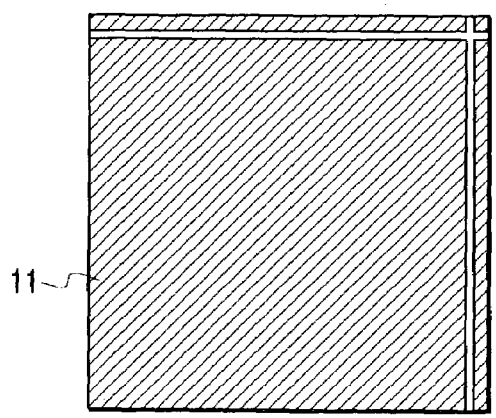

Tenthly, the pixel electrode 11 of the MIS type PD portion is formed through the photolithography using the wet etching (FIG. 22E).

Note that in FIG. 22E, for simplicity in explanation, the switch TFT and the respective wirings are omitted.

Eleventhly, the SiN layer serving as the second insulating layer, the a-Si layer serving as the second semiconductor layer 13, and the phosphorous-doped n+ layer serving as the second ohmic contact layer 14 are formed by the plasma CVD apparatus with the thicknesses of about 150 nm, 600 nm, and 20 nm, respectively. After that, the transparent electrode layer 15 made of ITO etc. is successively formed with the thickness of about 40 nm.

Twelfthly, the Mo layer, the Al layer, and the Mo layer, which constitute the bias wiring 16 of the MIS type PD are formed through sputtering with the thicknesses of about 50 nm, 400 nm, and 30 nm, respectively.

Figure 22F:
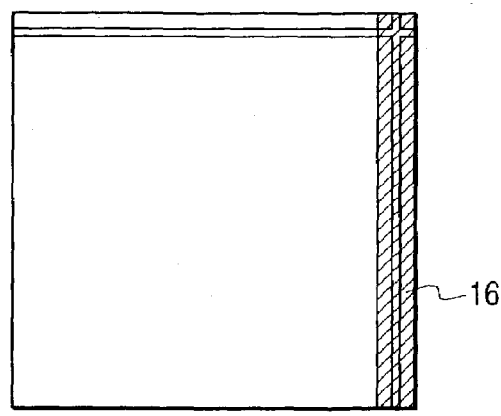

Thirteenthly, the bias wiring 16 of the MIS type PD is formed through the photolithography using the wet etching (FIG. 22F).

Fourteenthly, BCB is applied to form the second planarization layer 17 and the SiN layer is formed with the thickness of about 300 nm as the final protective layer.

Fifteenthly, the lead-out electrode portion or the like is exposed through the photolithography using the RIE or CDE method.

Sixteenthly, the phosphor layer 19 is bonded thereto using the adhesive layer 18.

Through the above processing, the FPD of this embodiment is manufactured.

In this way, the switch TFT and the MIS type PD are laminated through the interlayer insulating layer, so that the characteristics of both of the switch TFT and the MIS type PD can be increased at the same time. Furthermore, an influence of generation of particles in the a-Si layer, which is inevitably involved in terms of production, is reduced. Therefore, the X-ray detecting apparatus of this embodiment can be manufactured easily in terms of production. The semiconductor layer having the photoelectric conversion function is formed to extend over the plural pixels, thereby making it possible to increase efficiency.

(Embodiment 4)

In this embodiment, the X-ray detecting apparatus using the MIS type PD will be described.

Figure 23:
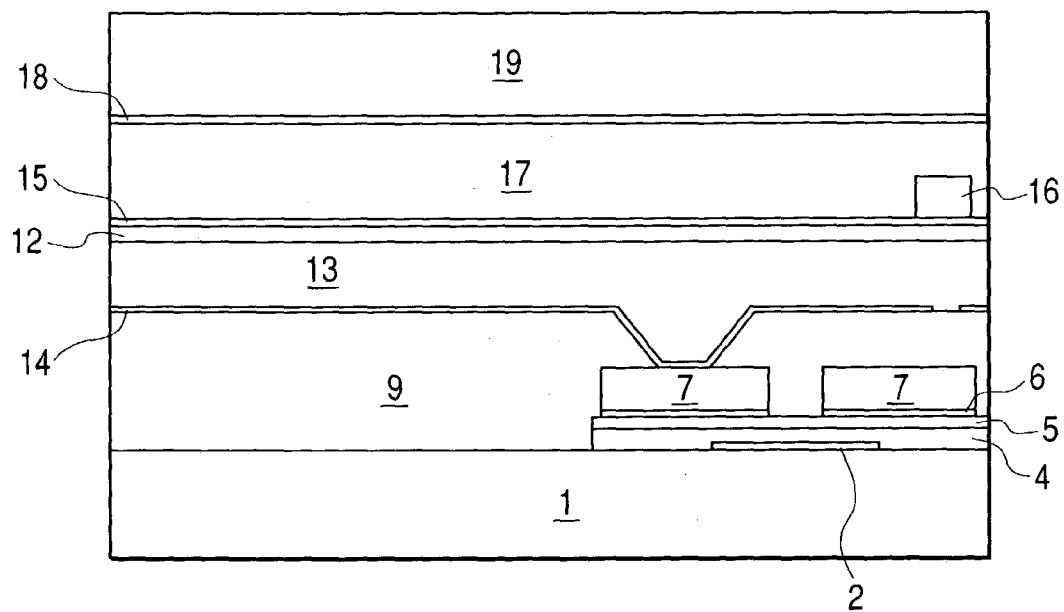
FIG. 23 is a schematic sectional view showing an X-ray detecting apparatus in accordance with Embodiment 4 of the present invention.

FIG. 23 is a schematic sectional view showing the X-ray detecting apparatus of this embodiment. Note that in FIG. 23, the same parts as those in, for example, FIG. 19 are denoted by the same reference numerals.

Hereinafter, the manufacturing method for the FPD of this embodiment will be described.

The first to eighth steps are the same as in Embodiment 4.

Ninthly, the phosphorous-doped $n^+$ layer is formed using the plasma CVD apparatus with the thickness of about 100 nm as the second ohmic contact layer of the MIS type PD.

Tenthly, the second ohmic contact layer 14 is formed through the photolithography using the RIE or CDE method as the pixel electrode 11 of the MIS type PD according to Embodiment 4.

Eleventhly, the a-Si layer serving as the second semiconductor layer 13 and the SiN layer serving as the second insulating layer 12 are formed by the plasma CVD apparatus with the thicknesses of about 600 nm and 150 nm, respectively. After that, the transparent electrode layer 15 made of ITO etc. is formed with the thickness of about 40 nm.

Twelfthly, the Mo layer, the Al layer, and the Mo layer, which constitute the bias wiring 16 of the MIS type PD are formed using a sputtering apparatus with the thicknesses of about 50 nm, 400 nm, and 30 nm, respectively.

Thirteenthly, the bias wiring 16 of the MIS type PD is formed through the wet etching.

Fourteenthly, BCB is applied to form the second planarization layer 17 and the SiN layer is formed with the thickness of about 300 nm as the final protective layer.

Fifteenthly, the lead-out electrode portion is exposed through the photolithography using the RIE or CDE method.

Sixteenthly, the phosphor layer 19 is bonded thereto using the adhesive layer 18.

Through the above processing, the FPD of this embodiment is manufactured.

In this embodiment, the second ohmic contact layer 17 is used for the pixel electrode 11 according to Embodiment 4. Considering the resistance value, the layer should have large film thickness. Depending on the manufacturing apparatus, however, the layer cannot be made thick. In this case, the additional conductive layer can be used in combination. That is, after the eighth step, it is possible that the conductive layer is formed to form the pixel electrode 11 and then, the manufacturing process restarts with the ninth step. In this embodiment as well, the semiconductor layer having the photoelectric conversion function is formed to extend over the plural pixels, so that the efficiency can be increased.

(Embodiment 5)

In this embodiment, the X-ray detecting apparatus using the MIS type PD will be described. In this embodiment, while devising the arrangement of the bias wirings, spatial resolution is increased.

Figure 24:
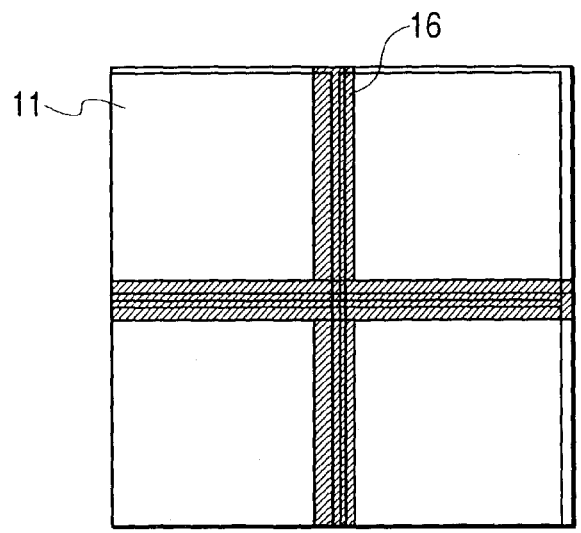
FIG. 24 is a schematic plan view showing an X-ray detecting apparatus in accordance with Embodiment 5 of the present invention.

FIG. 24 is a schematic plan view showing the X-ray detecting apparatus of this embodiment. In 2×2 pixels, each bias wiring 16 is arranged between the adjustment pixel electrodes 11 of the MIS type PD.

Therefore, when the conversion light from the phosphor layer 19 enters the MIS type PD, the bias wiring 16 serves to block the incidence of light from the adjustment pixel, thereby providing effects in that the spatial resolution is increased.

(Embodiment 6)

Figure 9:
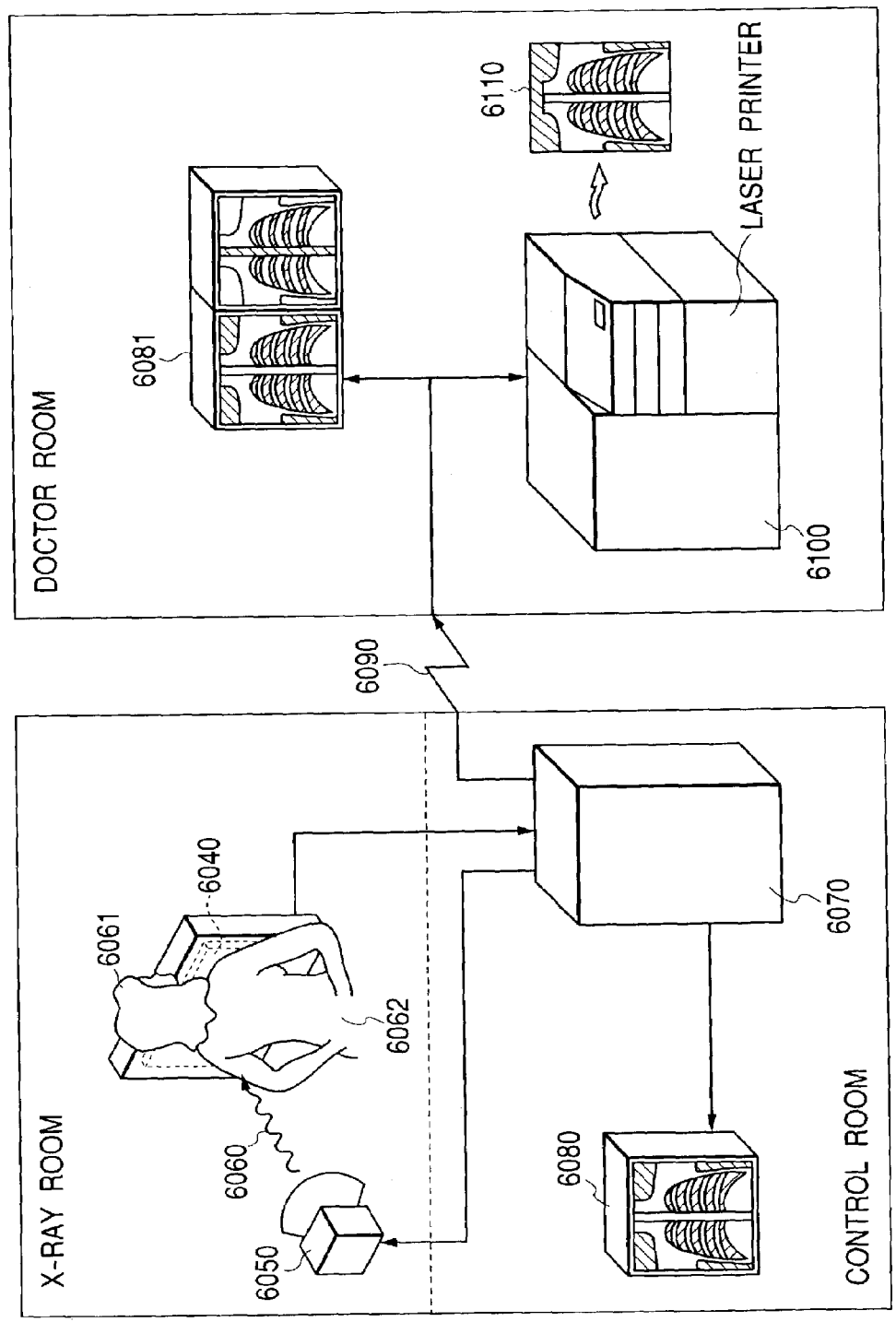
FIG. 9 shows an application example to an X-ray diagnosis system of a radiation detecting apparatus in accordance with the present invention.
Figure 10:
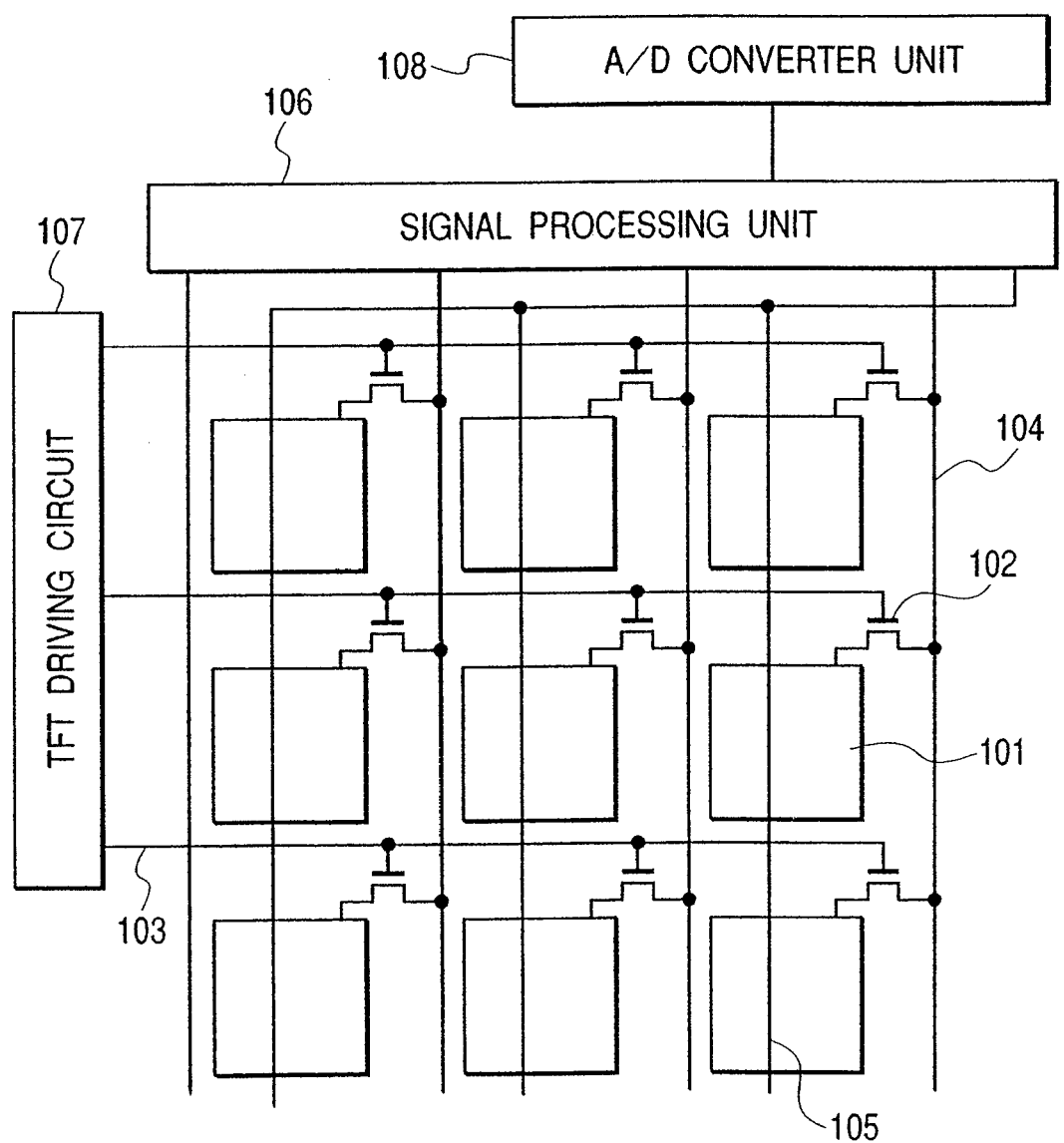
FIG. 10 is a schematic equivalent circuit diagram of a conventional FPD.
Figure 11:
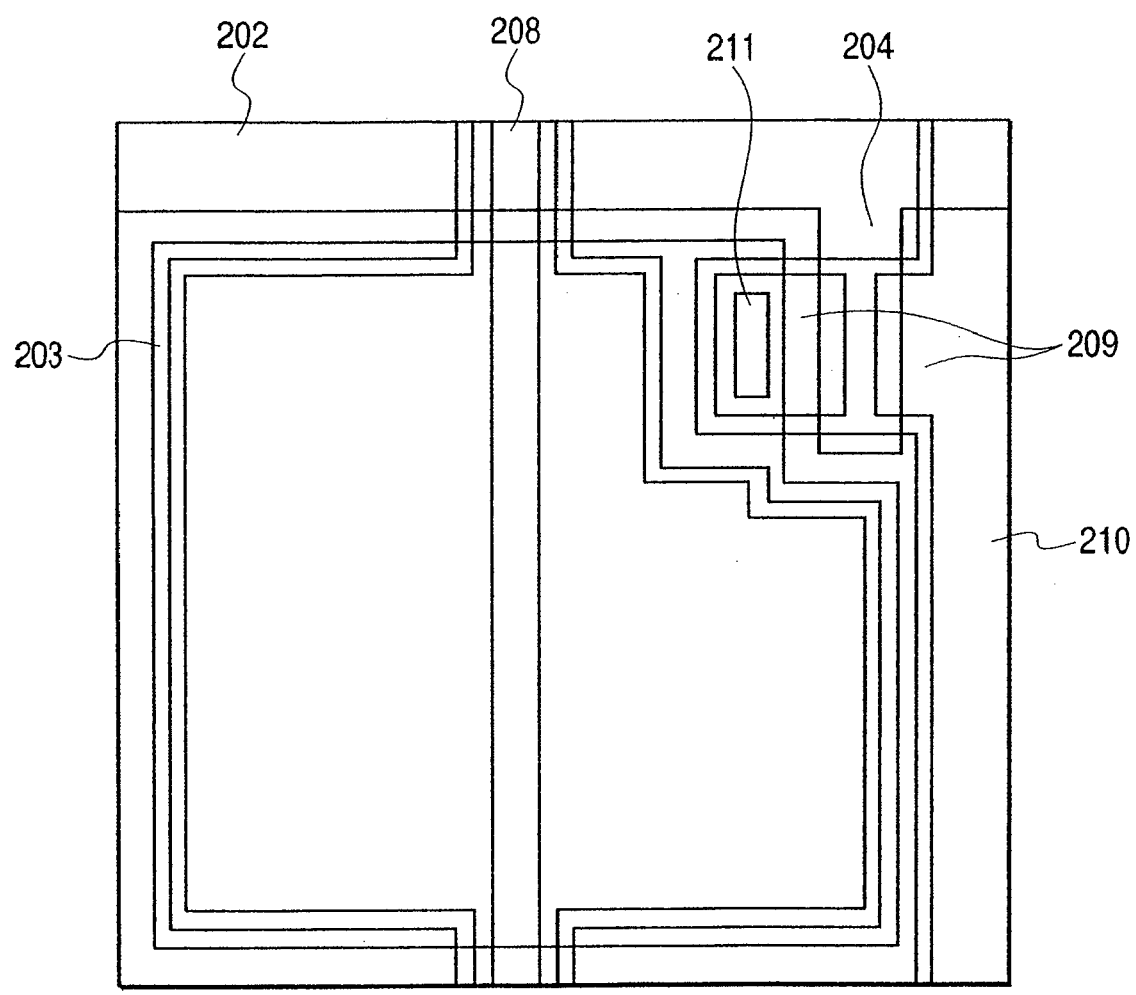
FIG. 11 is a schematic plan view showing one pixel in a conventional case.
Figure 12:
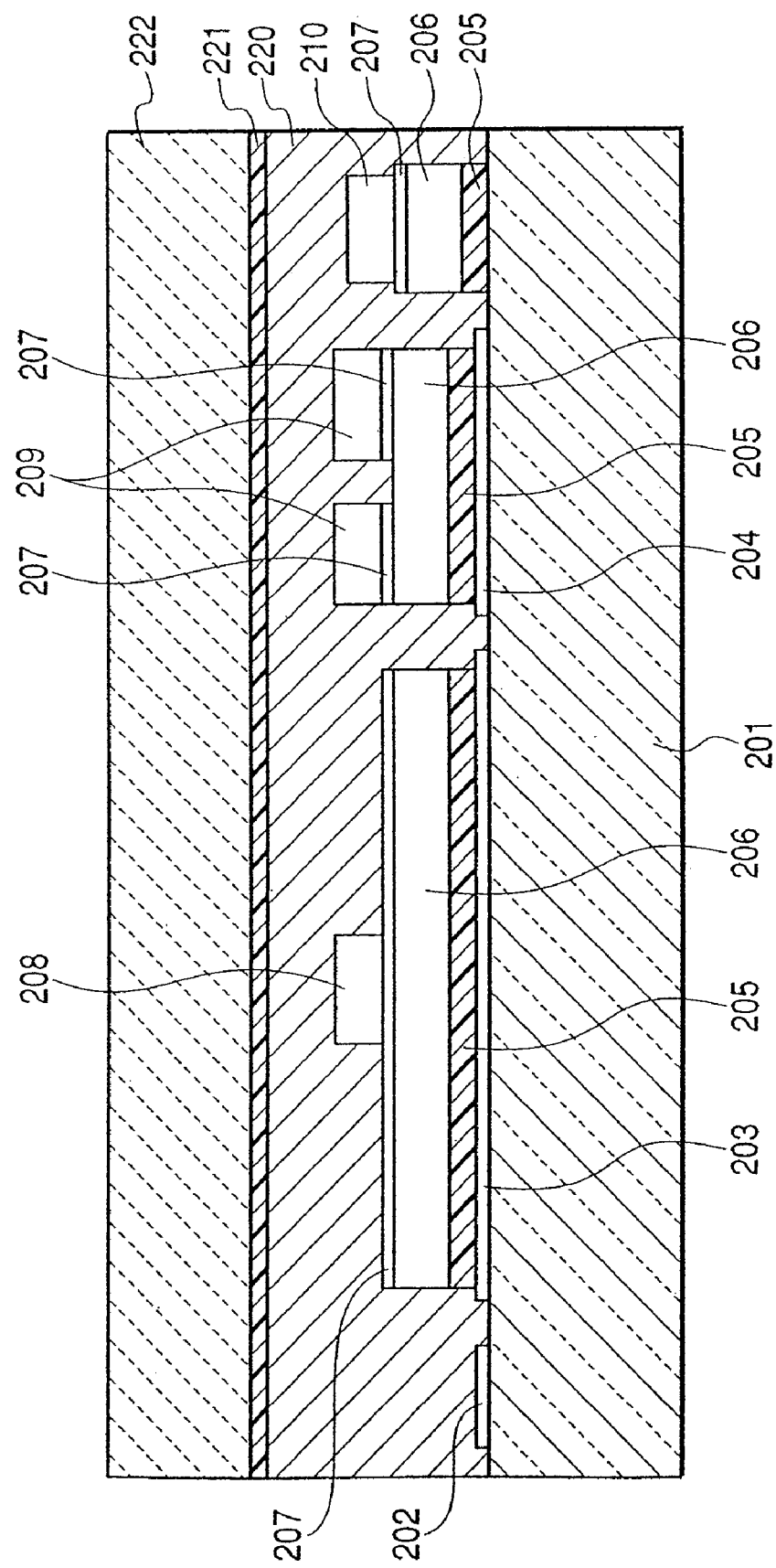
FIG. 12 is a schematic sectional view showing an element array in one pixel in a conventional case.
Figure 13:
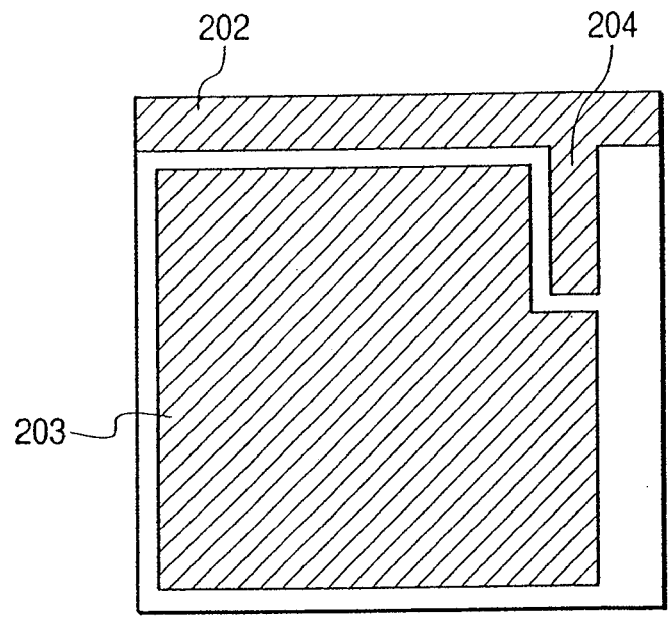
FIG. 13 is a schematic plan view illustrating a conventional manufacturing method for an FPD.
Figure 14:
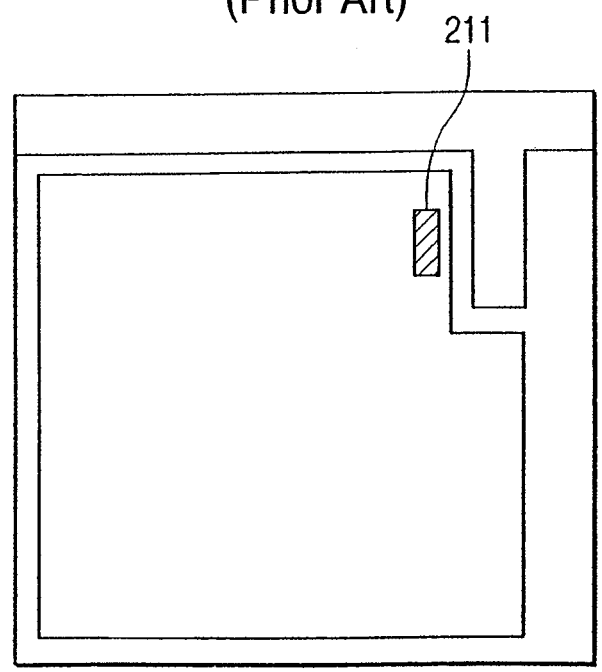
FIG. 14 is a schematic plan view illustrating a conventional manufacturing method for an FPD.
Figure 15:
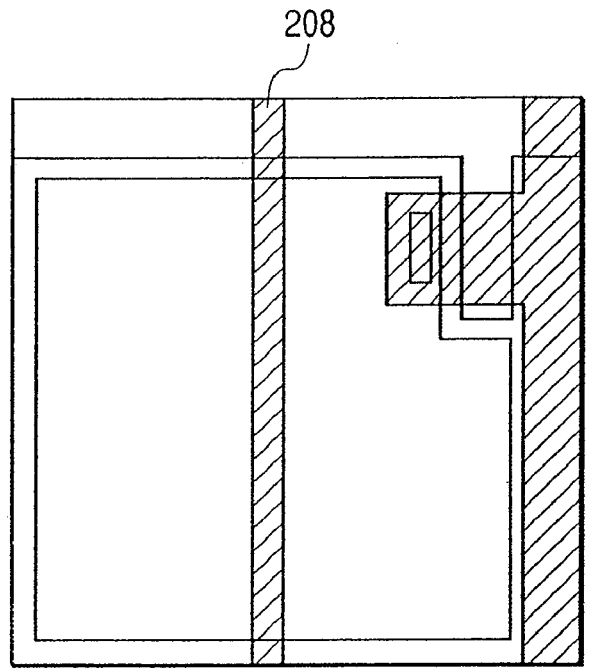
FIG. 15 is a schematic plan view illustrating a conventional manufacturing method for an FPD.
Figure 16:
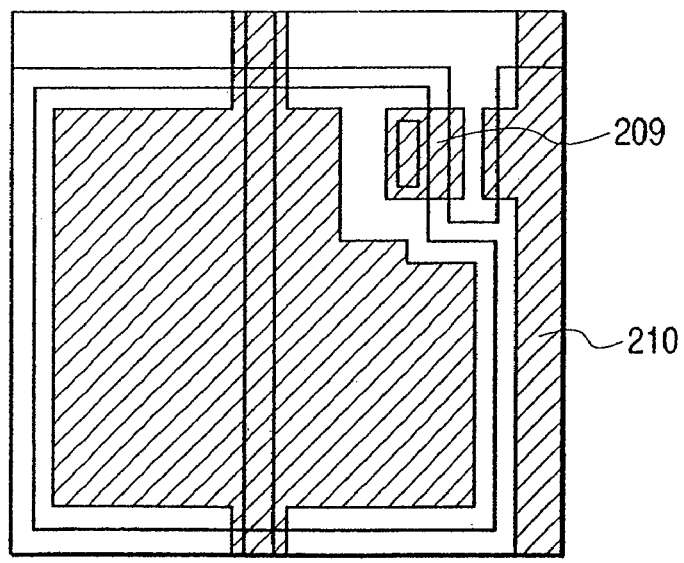
FIG. 16 is a schematic plan view illustrating a conventional manufacturing method for an FPD.
Figure 17:
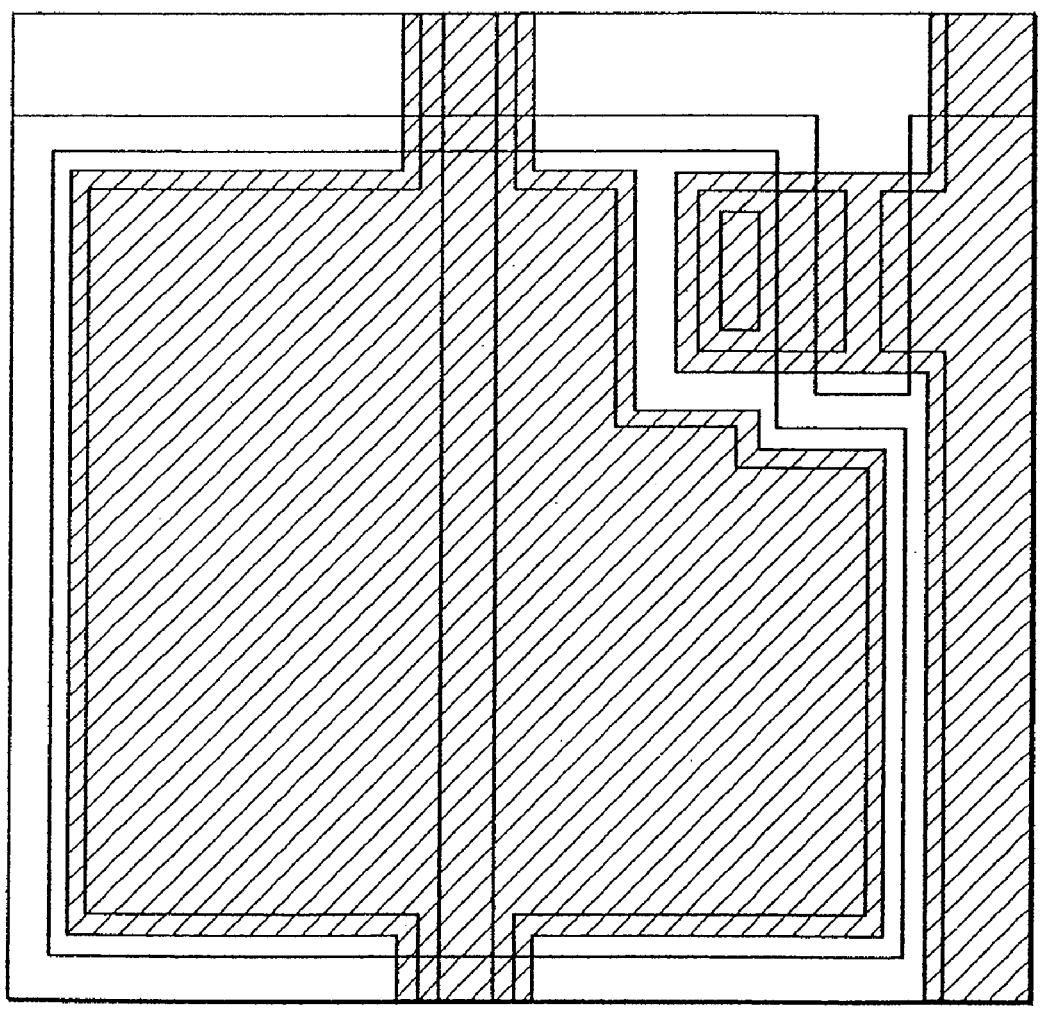
FIG. 17 is a schematic plan view illustrating a conventional manufacturing method for an FPD.
Figure 18:
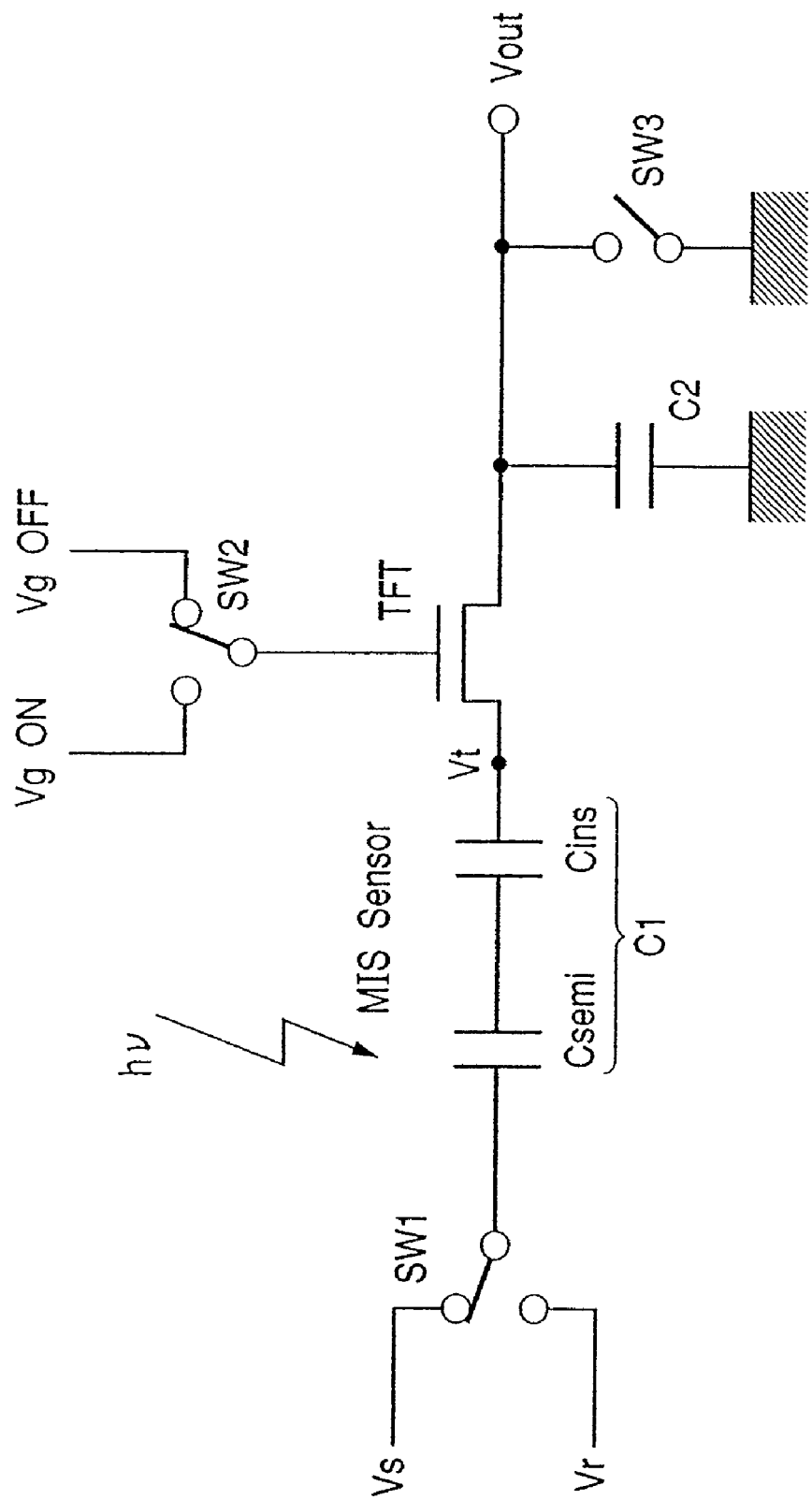
FIG. 18 is circuit diagram showing a 1-bit equivalent circuit of a conventional MIS type FPD.

FIG. 9 shows an application example to an X-ray diagnosis system of the radiation detecting apparatus in accordance with the present invention.

An X-ray 6060 generated in an X-ray tube 6050 passes through a chest 6062 of a patient or a subject 6061 to enter a radiation detecting apparatus (image sensor) 6040. The incident X-ray includes information on the interior of the body of the subject 6061. In accordance with the incidence of the X-ray, the ray is converted to the visible light by the phosphor provided on the front or rear side. The visible light is subjected to photoelectric conversion to obtain electric signals. The electric signals undergo digital conversion, followed by image processing through an image processor 6070. The image thus obtained can be checked on a display 6080 in a control room.

Also, the image information can be transferred to remote locations via transmitting means such as a telephone line 6090. The information can also be displayed on a display 6081 in a separate place, e.g., a doctor room or stored in an optical disk and other such storage means. Accordingly, doctors at the remote locations can also make diagnosis. Also, through a film processor 6100, the information can be recorded on a film 6110.

In the above embodiments, the X-ray image pickup system has been described by way of example. However, the same is applicable even to the case of adopting the apparatus construction where the radiation is converted to the light using a scintillator and the light undergoes the photoelectric conversion. Note that the radiation includes, for example, α, β, and γ rays other than the X-ray.

What is claimed is:

1. A radiation detecting apparatus comprising:
   a plurality of switches TFTs each comprising a gate electrode, a first insulating layer on the gate electrode, a first semiconductor layer on the first insulating layer, an ohmic contact layer on the first semiconductor layer, and a source/drain electrode on the ohmic contact layer;
   a plurality of radiation conversion elements each of which is arranged on each of the switches TFTs, and which comprises a lower electrode formed from the same layer as the source/drain electrode of the switches TFTs;
   a second insulating layer, a second semiconductor layer, and a second ohmic contact layer, which are arranged on the lower electrode in this order, such that the second semiconductor layer covers the whole of the lower electrodes of the radiation conversion elements; and
   a bias wiring for applying a bias voltage to the radiation conversion element.

2. A radiation detecting apparatus according to claim 1, wherein the switch TFT comprises an etch stopper type TFT.

3. A radiation image pickup system comprising:
   a radiation source for irradiating a subject or an object to be inspected with a radiation;
   the radiation detecting apparatus according to claim 1 for detecting the radiation; image processing means for processing an image through digital conversion of signals corresponding to the detected radiation; and display means for displaying the processed image.

4. A manufacturing method for a radiation detecting apparatus having a radiation conversion element laminated on a switch TFT, comprising the steps of:
   (a) forming a gate electrode and a driving wiring of the switch TFT using a first metallic layer;

(b) laminating a first insulating layer, a first semiconductor layer, and a second insulating layer in order;
(c) etching the second insulating layer;
(d) forming an ohmic contact layer;
(e) forming a second metallic layer;
(f) patterning the second metallic layer to form a source/drain electrode of the switch TFT and a lower electrode of the radiation conversion element;
(g) laminating a third insulating layer, a second semiconductor layer, and a second ohmic contact layer in this order, such that the second semiconductor layer covers the whole of the lower electrode of the radiation conversion element;
(h) laminating a third metallic layer thereon; and
(i) patterning the third metallic layer to form a bias wiring of the radiation conversion element.

5. A manufacturing method for a radiation detecting apparatus according to claim 4, wherein the step (c) is performed through rear-side exposure.

6. A manufacturing method for a radiation detecting apparatus according to claim 4, further comprising, after the step (i), the step of forming a transparent electrode layer.

7. A radiation detecting apparatus comprising:
a wavelength converter for converting a radiation into a visible light, and including a plurality of pixels, each pixel including a photoelectric conversion element having a pixel electrode, an insulating layer, and a semiconductor layer for converting the visible light into an electric signal; and
a transistor for controlling the readout of the electric signal converted by the photoelectric conversion element,
wherein the photoelectric conversion element is arranged on the wavelength converter side of the transistor, the pixel electrode is divided into pieces for each pixel, and the semiconductor layer covers the whole of the plurality of pixels.

8. A radiation detecting apparatus according to claim 7, further comprising:
a planarization layer is arranged between the transistor and the photoelectric conversion element.

* * * * *

UNITED STATES PATENT AND TRADEMARK OFFICE
CERTIFICATE OF CORRECTION

PATENT NO. : 7,214,945 B2
APPLICATION NO. : 10/455457
DATED : May 8, 2007
INVENTOR(S) : Nomura et al.

It is certified that error appears in the above-identified patent and that said Letters Patent is hereby corrected as shown below:

COLUMN 1:
 Line 12, "like" should read -- like, --; and
 Line 22, "information" should read -- information infrastructure construction, a flat panel detector --.

Signed and Sealed this

Eighteenth Day of November, 2008

JON W. DUDAS
*Director of the United States Patent and Trademark Office*